United States Patent
Edelstein et al.

(10) Patent No.: US 7,068,138 B2
(45) Date of Patent: Jun. 27, 2006

(54) HIGH Q FACTOR INTEGRATED CIRCUIT INDUCTOR

(75) Inventors: Daniel C. Edelstein, White Plains, NY (US); Panayotis C. Andricacos, Croton-on-Hudson, NY (US); John M. Cotte, New Fairfield, CT (US); Hariklia Deligianni, Tenafly, NJ (US); John H. Magerlein, Yorktown Heights, NY (US); Kevin S. Petrarca, Newburgh, NY (US); Kenneth J. Stein, Sandy Hook, CT (US); Richard P. Volant, New Fairfield, CT (US)

(73) Assignee: International Business Machines Corporation, Armonk, NY (US)

( * ) Notice: Subject to any disclaimer, the term of this patent is extended or adjusted under 35 U.S.C. 154(b) by 55 days.

(21) Appl. No.: 10/768,773

(22) Filed: Jan. 29, 2004

(65) Prior Publication Data

US 2005/0167780 A1 Aug. 4, 2005

(51) Int. Cl.
*H01F 27/24* (2006.01)

(52) U.S. Cl. ............... 336/200; 336/223; 336/219; 336/229

(58) Field of Classification Search ........... 257/758, 257/760, 762
See application file for complete search history.

(56) References Cited

U.S. PATENT DOCUMENTS

| 5,148,062 | A | * | 9/1992 | Goldferb |
| 5,363,080 | A | * | 11/1994 | Breen |
| 5,793,272 | A | * | 8/1998 | Burghartz et al. ......... 336/200 |
| 5,884,990 | A | | 3/1999 | Burghartz et al. |
| 6,054,329 | A | | 4/2000 | Burghartz et al. |
| 6,114,937 | A | | 9/2000 | Burghartz et al. |
| 6,133,136 | A | | 10/2000 | Edelstein et al. |
| 6,187,680 | B1 | | 2/2001 | Costrini et al. |
| 6,251,528 | B1 | | 6/2001 | Uzoh et al. |

(Continued)

FOREIGN PATENT DOCUMENTS

WO WO03017479 A2 2/2003

OTHER PUBLICATIONS

Research Disclosure, Apr. 2000, An On-Chip Three-Dimensional Inductor By Damascene Process, pp. 682-683.

(Continued)

*Primary Examiner*—Fetsum Abraham
(74) *Attorney, Agent, or Firm*—Schmeiser, Olsen & Watts; William H. Steinberg

(57) ABSTRACT

An inductor and a method of forming and the inductor, the method including: (a) providing a semiconductor substrate; (b) forming a dielectric layer on a top surface of the substrate; (c) forming a lower trench in the dielectric layer; (d) forming a resist layer on a top surface of the dielectric layer; (e) forming an upper trench in the resist layer, the upper trench aligned to the lower trench, a bottom of the upper trench open to the lower trench; and (f) completely filling the lower trench at least partially filling the upper trench with a conductor in order to form the inductor. The inductor including a top surface, a bottom surface and sidewalls, a lower portion of said inductor extending a fixed distance into a dielectric layer formed on a semiconductor substrate and an upper portion extending above said dielectric layer; and means to electrically contact said inductor.

30 Claims, 14 Drawing Sheets

U.S. PATENT DOCUMENTS

| | | |
|---|---|---|
| 6,297,140 B1 | 10/2001 | Uzoh et al. |
| 6,323,128 B1 | 11/2001 | Sambucetti et al. |
| 6,333,559 B1 | 12/2001 | Costrini et al. |
| 6,335,104 B1 | 1/2002 | Sambucetti et al. |
| 6,368,484 B1 | 4/2002 | Volant et al. |
| 6,444,517 B1 | 9/2002 | Hsu et al. |
| 6,457,234 B1 | 10/2002 | Edelstein et al. |
| 6,534,374 B1 | 3/2003 | Johnson et al. |
| 6,551,931 B1 | 4/2003 | Edelstein et al. |
| 6,842,605 B1 * | 1/2005 | Lappetelainen et al. ... 455/13.4 |
| 2002/0172025 A1 | 11/2002 | Megahed et al. |
| 2002/0197844 A1 | 12/2002 | Johnson et al. |
| 2003/0067052 A1 | 4/2003 | Matsuo et al. |

OTHER PUBLICATIONS

Burghartz et al., Monolithic Spiral Inductors Fabricated Using A VLSI Cu—Damascene Interconnect Technology And Low-Loss Substrates, pp. 4.5.1-4.5.4, 1996 IEEE.

Edelstein et al., Spiral And Solenoidal Inductor Structures On Silicon Using Cu—Damascene Interconnects, 1998 IEEE, pp. 18-20.

Burghartz et al., Spiral Inductors And Transmission lines In Silicon Technology Using Copper-Damascene Interconnects And Low-Loss Substrates, 1997IEEE, pp. 1961-1968.

* cited by examiner

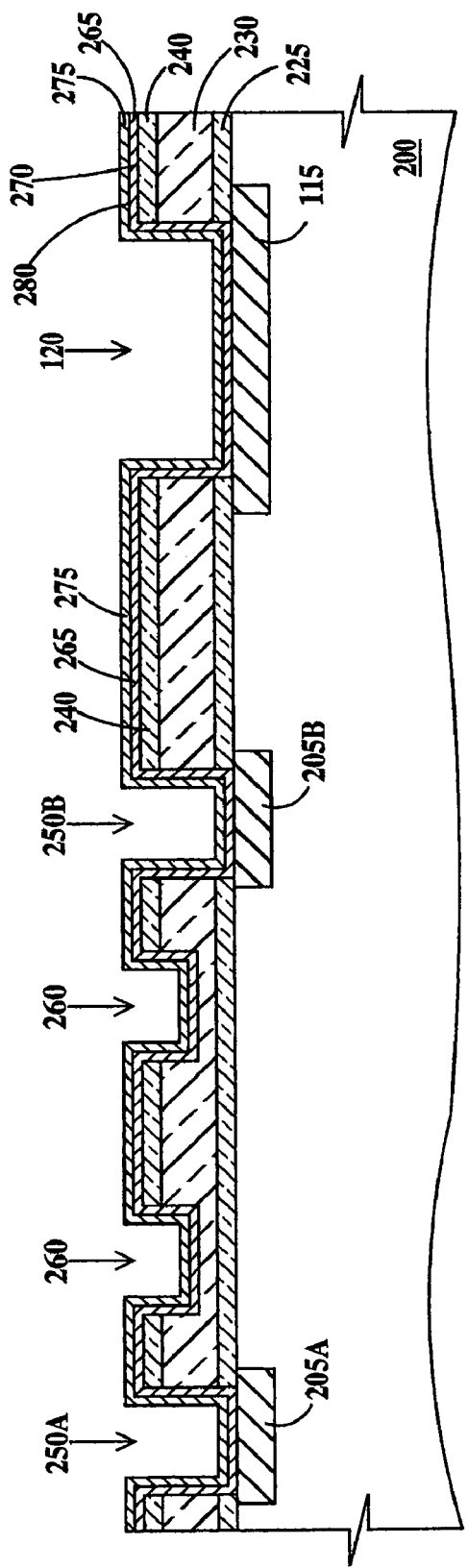
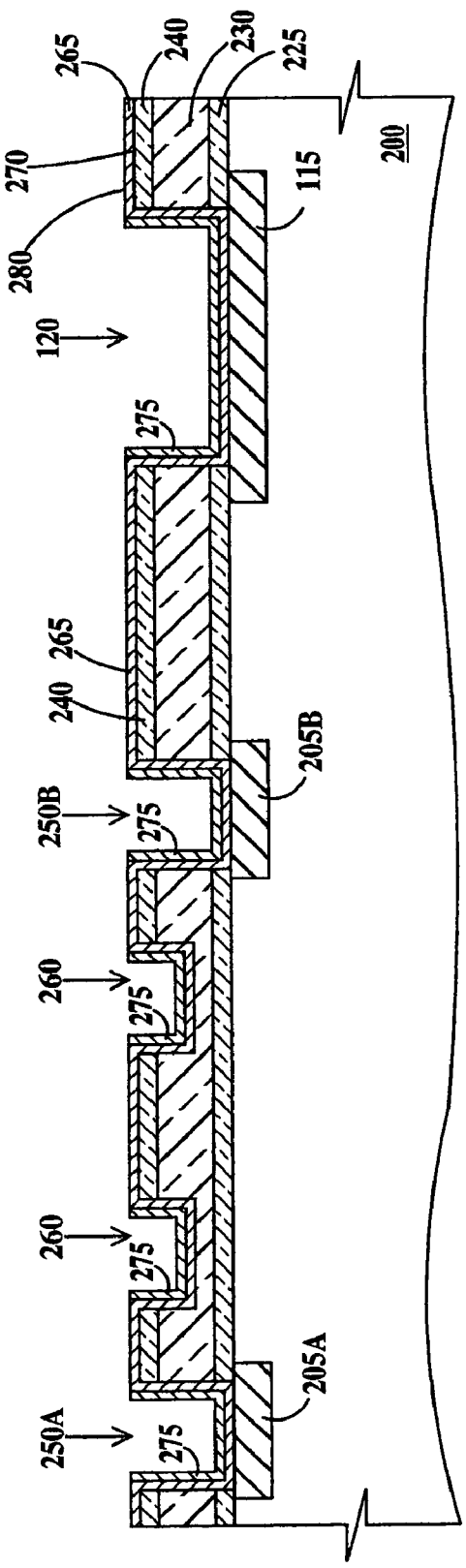
FIG. 4E
FIG. 4F

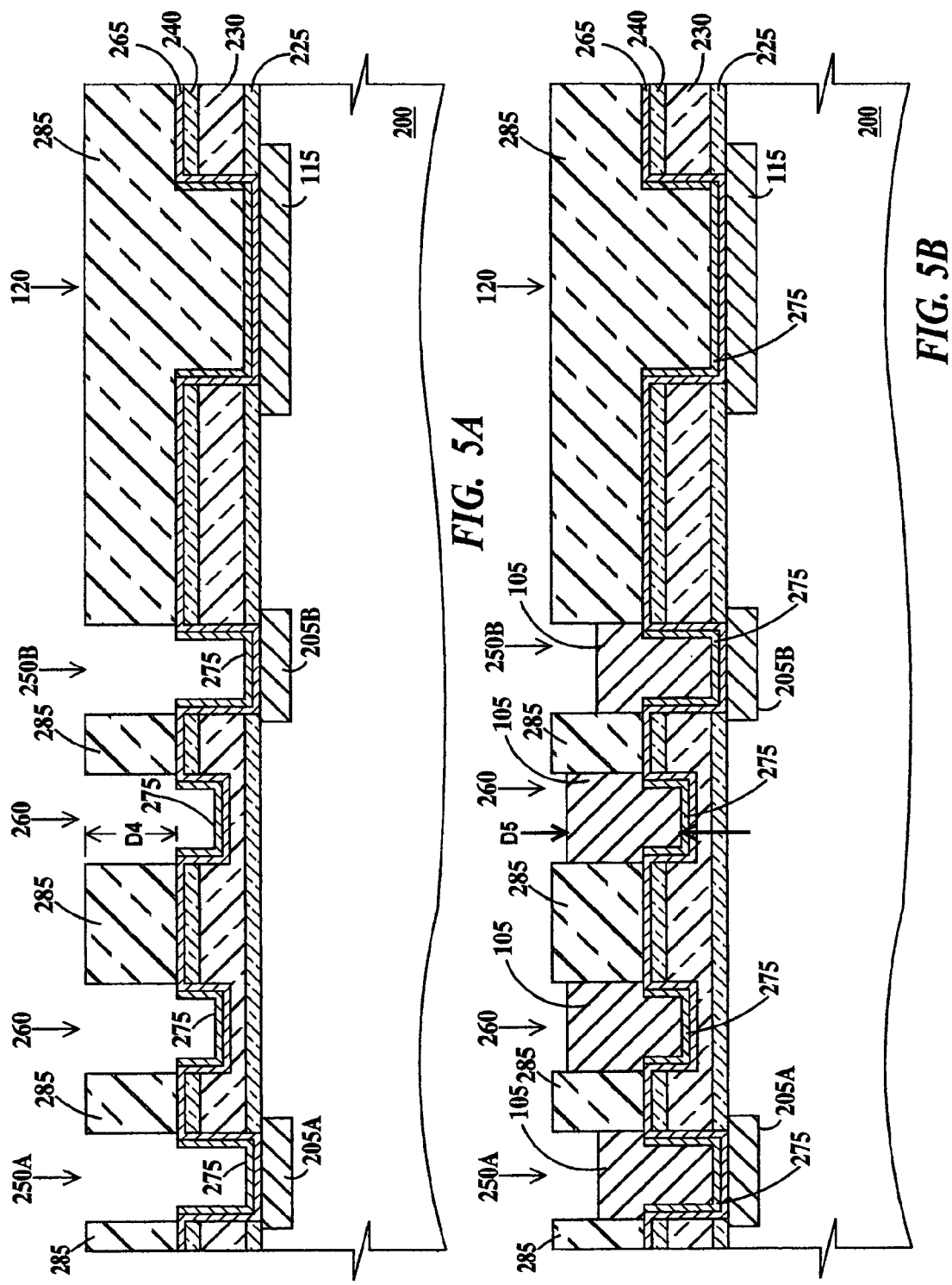

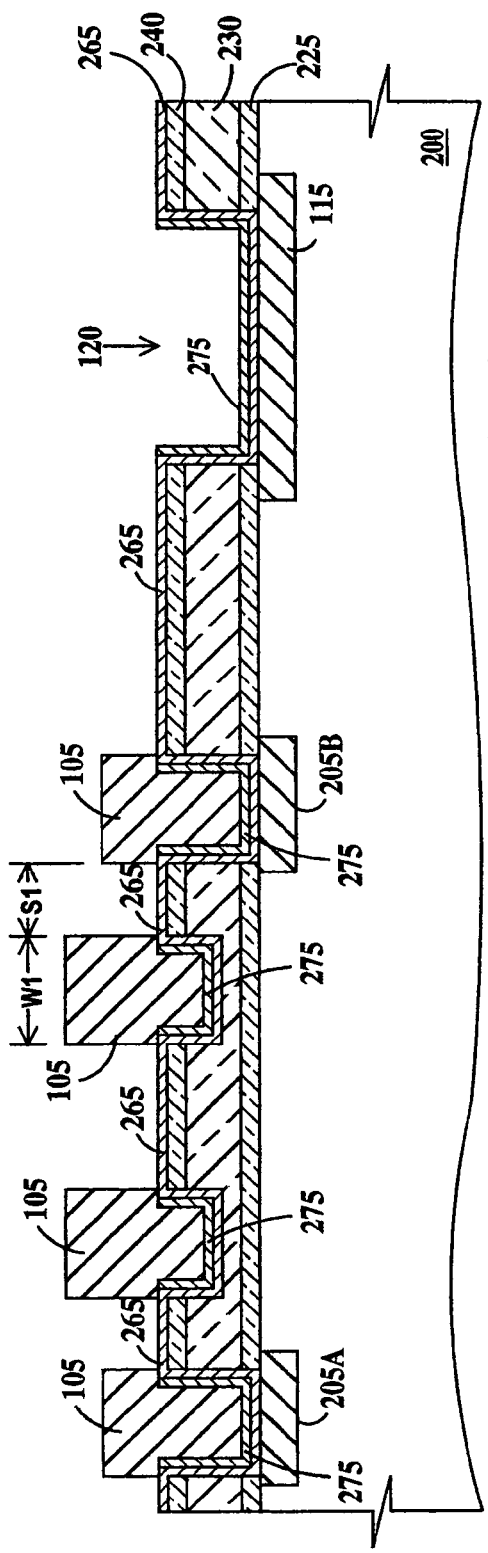
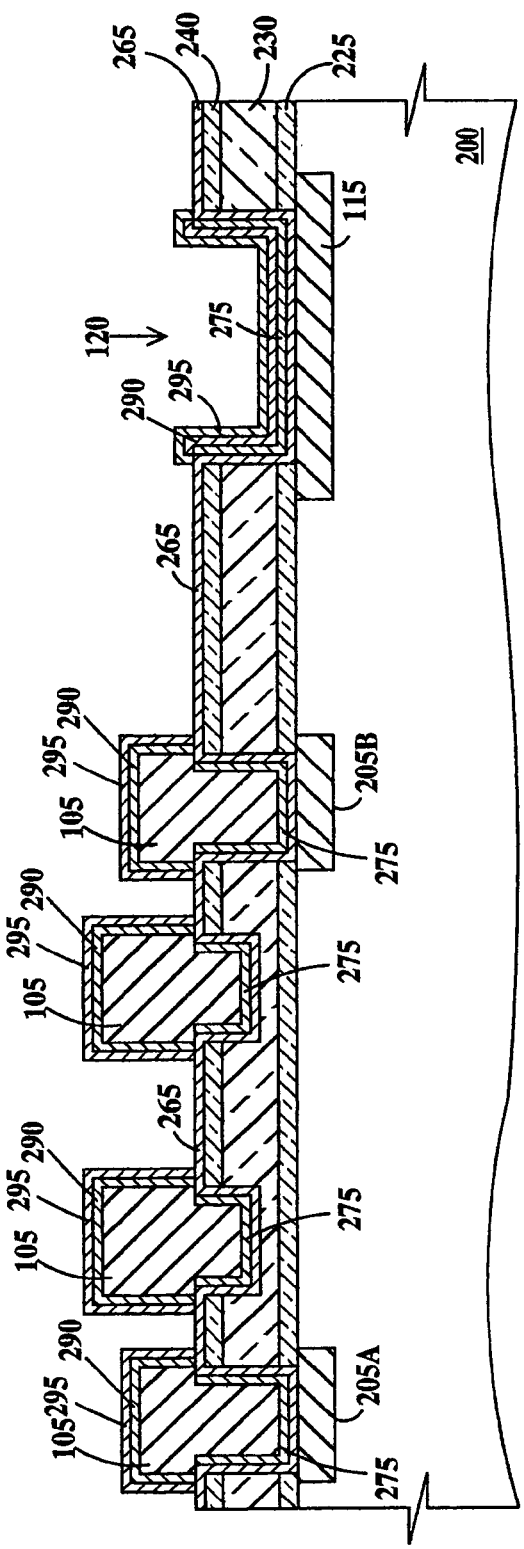
FIG. 5C
FIG. 5D

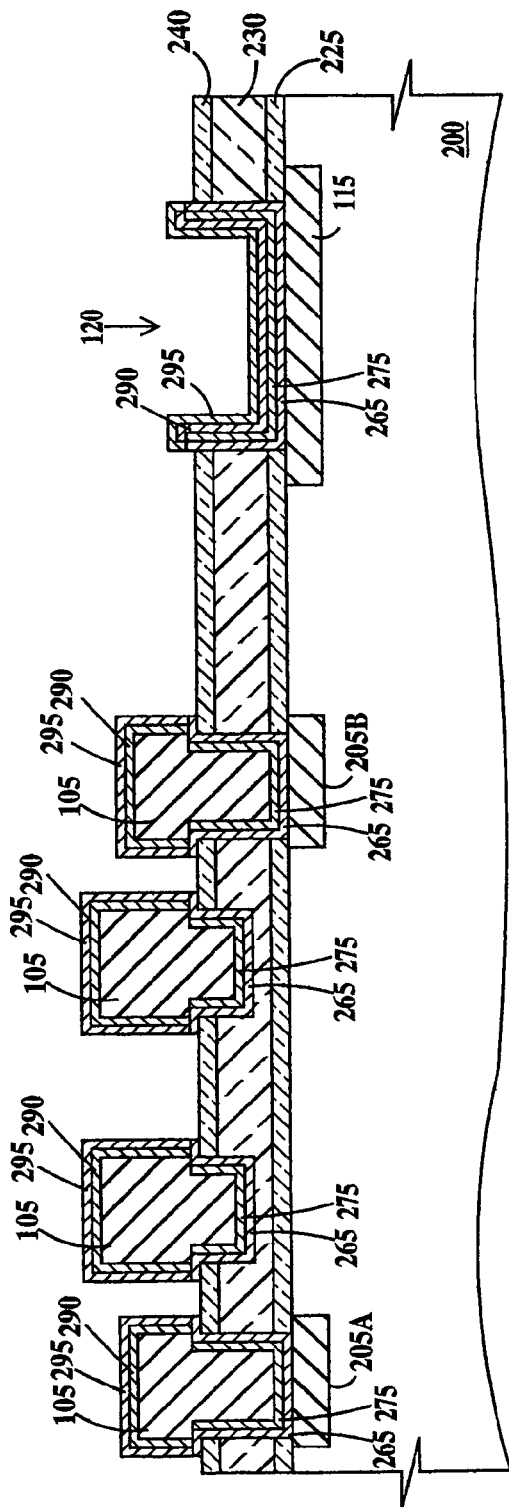
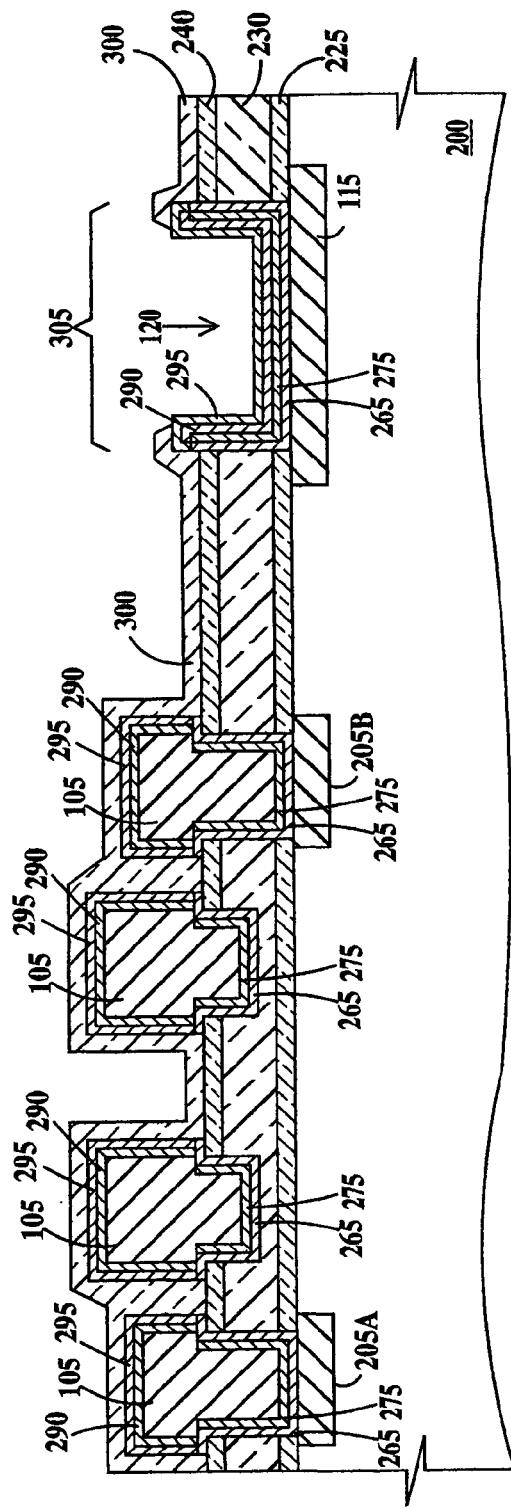
FIG. 5E
FIG. 5F

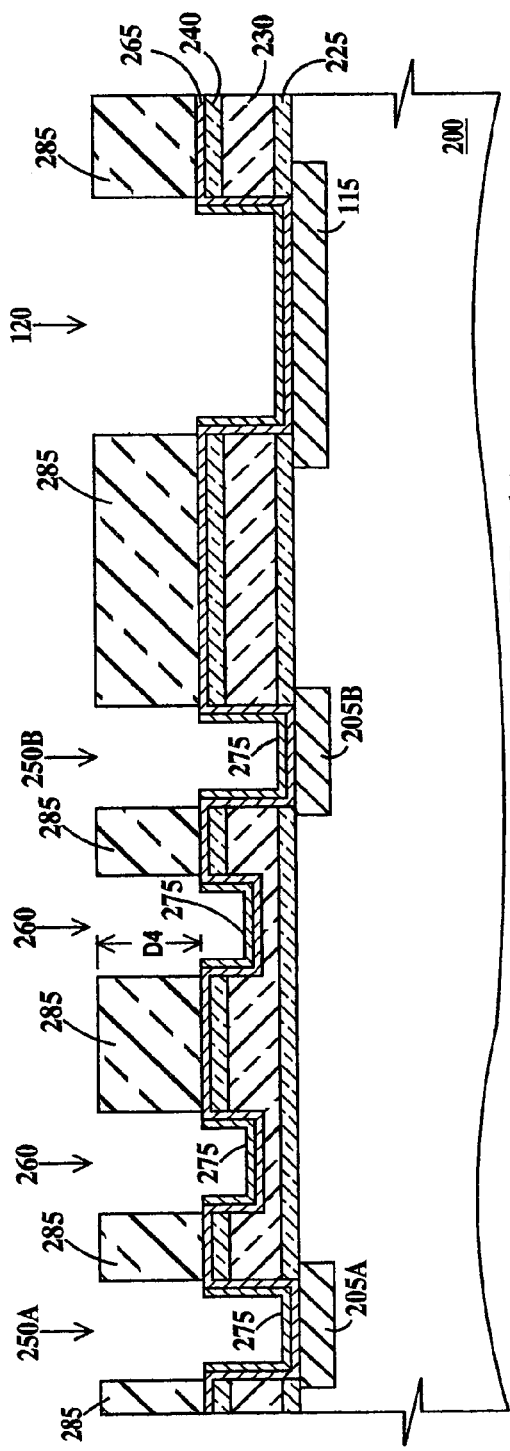
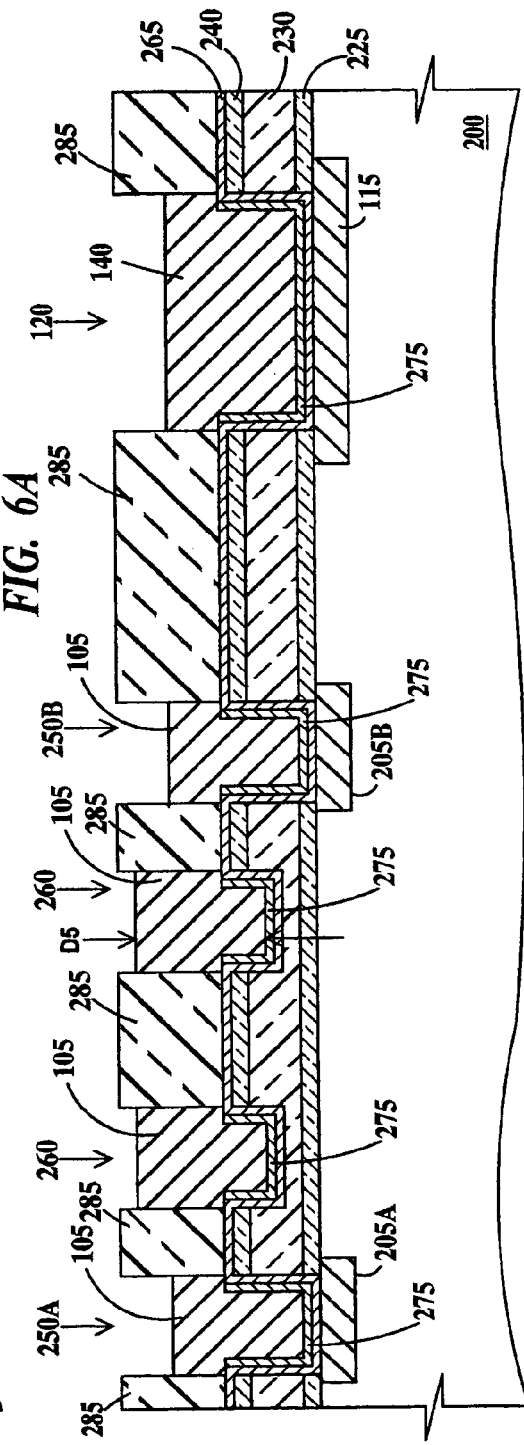
FIG. 6A
FIG. 6B

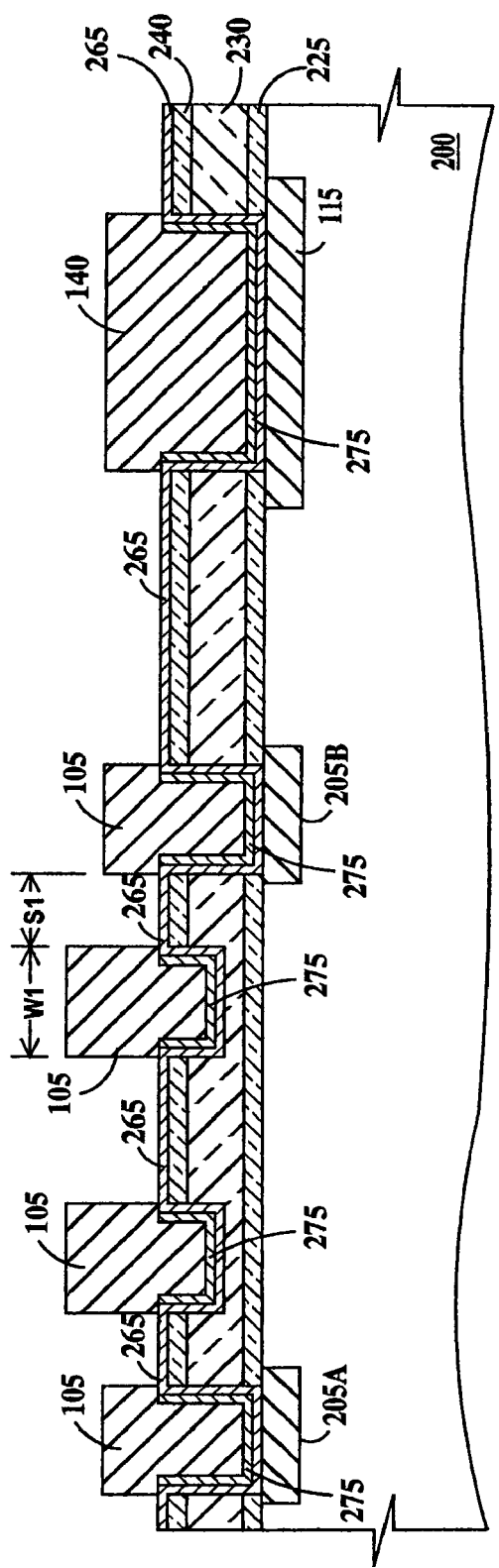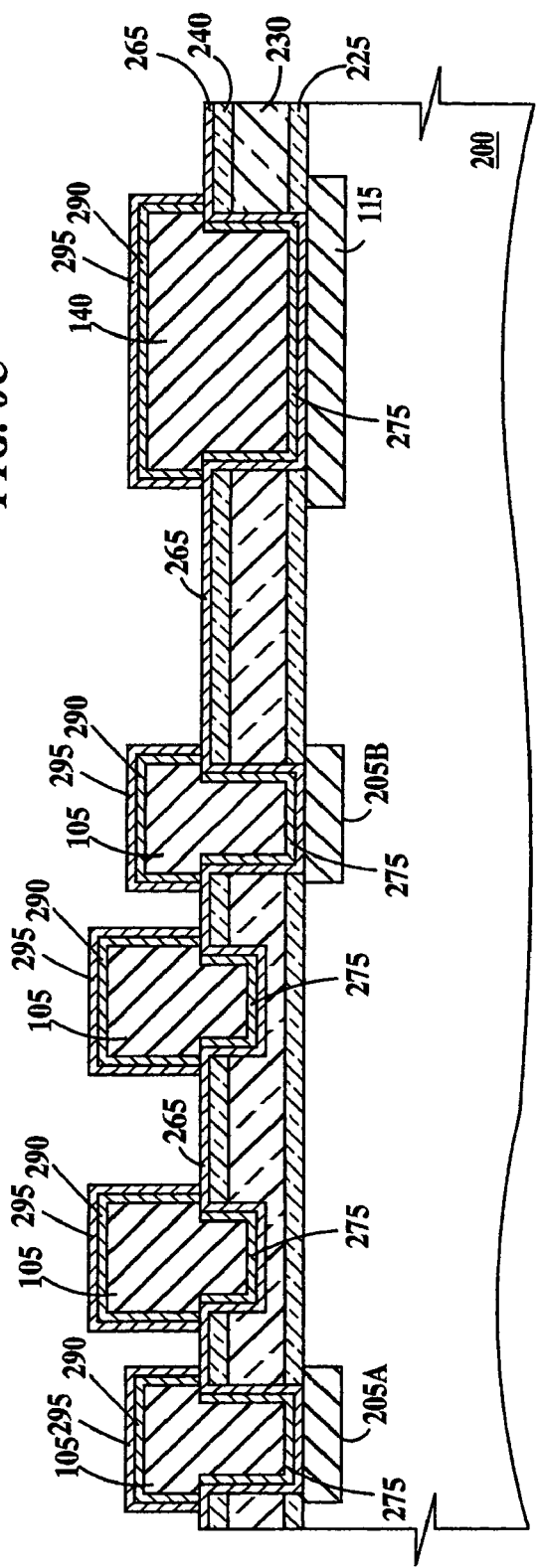
FIG. 6C
FIG. 6D

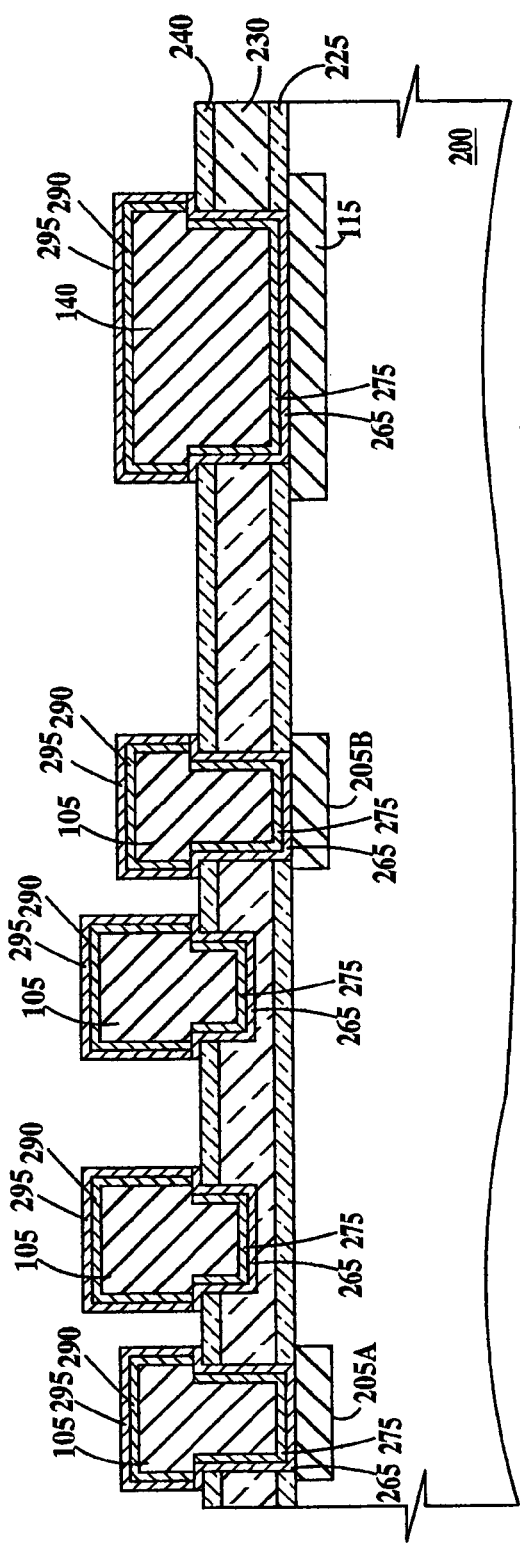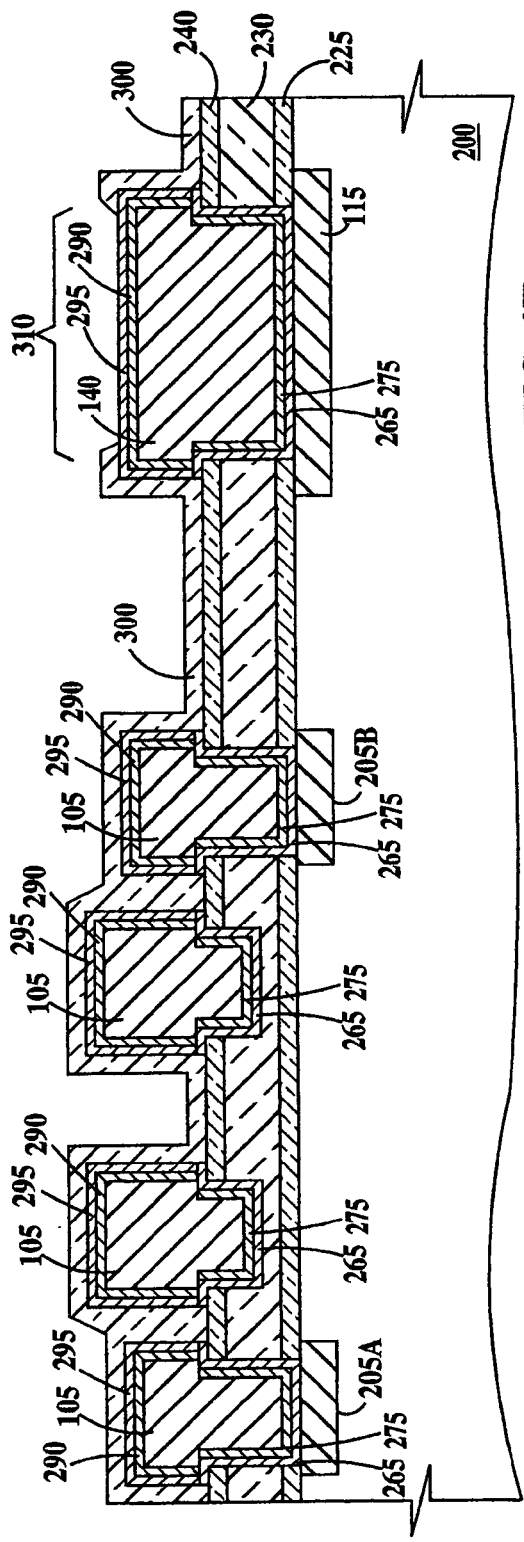

HIGH Q FACTOR INTEGRATED CIRCUIT INDUCTOR

FIELD OF THE INVENTION

The present invention relates to the field of integrated circuits; more specifically, it relates to high quality (Q) factor inductor structures, methods of fabricating high Q factor inductor structures and methods of integration of high Q factor inductor structures into integrated circuit manufacturing processes.

BACKGROUND OF THE INVENTION

Inductors are used in many integrated circuits intended for radio-frequency (RF) applications. Inductors are typically fabricated of relatively thick metals on or near the surface of integrated circuit chips. As the RF frequency that integrated circuits operate at increases, power consumption increases unless the Q factor of the inductors increase as well. The Q factor of an inductor is defined as Q=Es/El, where Es is the amount energy that is stored in the reactive portion of the inductor and El is the amount of energy that is lost in the reactive portion of the inductor. The Q value of an inductor can also be expressed as $Q=W_0L/R$, where $W_0$ is the resonant frequency, L is the inductive value and R is the resistance of the inductor. The significance of the second equation is that Q increases as R decreases.

Fabricating the inductor using high conductivity metal, wide metal lines or thick metal lines can reduce resistance in an inductor. However, the use of wide metal lines inductors can consume large amounts of integrated circuit chip surface and suitable areas of an integrated circuit for placement of inductors is often very limited. The fabrication of thick metal inductors especially when using high conductivity metals and the subsequent integration of high conductivity, thick metal inductors into the inter-connection layers of integrated circuits is problematical. Therefore, there is a need for high Q factor, thick metal inductors formed of high conductivity metal and methods and integration schemes compatible with inter-connection layer fabrication techniques for forming inductors for integrated circuit chips.

SUMMARY OF THE INVENTION

A first aspect of the present invention is a method of forming an inductor, comprising in the order recited: (a) providing a semiconductor substrate; (b) forming a dielectric layer on a top surface of the substrate; (c) forming a lower trench in the dielectric layer; (d) forming a resist layer on a top surface of the dielectric layer; (e) forming an upper trench in the resist layer, the upper trench aligned to the lower trench, a bottom of the upper trench open to the lower trench; and (f) completely filling the lower trench and at least partially filling the upper trench with a conductor in order to form the inductor.

A second aspect of the present invention is a method of forming an inductor, comprising in the order recited: (a) providing a semiconductor substrate; (b) forming a dielectric layer on a top surface of the substrate; (c) forming a lower trench in the dielectric layer; (d) forming a conformal conductive liner in the lower trench and over a top surface of the dielectric layer; (e) forming a conformal Cu seed layer over the conductive liner; (f) forming a resist layer on the substrate; (g) forming an upper trench in the resist layer, the upper trench aligned to the lower trench, a bottom of the upper trench open to the lower trench; (h) electroplating Cu to completely fill the lower trench and at least partially fill the upper trench in order to form the inductor; (i) removing the resist layer; (j) selectively forming a conductive passivation layer over all exposed Cu surfaces; and (k) selectively removing the Cu seed layer from regions of the conductive liner overlying the surface of the dielectric layer and removing the conductive liner from the surface of the dielectric layer.

A third aspect of the present invention is a semiconductor structure, comprising: an inductor having a top surface, a bottom surface and sidewalls, a lower portion of the inductor extending a fixed distance into a dielectric layer formed on a semiconductor substrate and an upper portion extending above the dielectric layer; and means to electrically contact the inductor.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIGS. 4A through 4F are partial cross-sectional views illustrating fabrication steps common to the first, second and third embodiments of the present invention;

FIGS. 5A through 5F are partial cross-sectional views illustrating fabrication steps subsequent to the steps illustrated in FIGS. 4A through 4F, common to the first and second embodiments of the present invention;

FIGS. 6A through 6G are partial cross-sectional views illustrating fabrication steps subsequent to the steps illustrated in FIGS. 4A through 4F, for the third embodiment of the present invention.

DETAILED DESCRIPTION OF THE INVENTION

Figure 1:
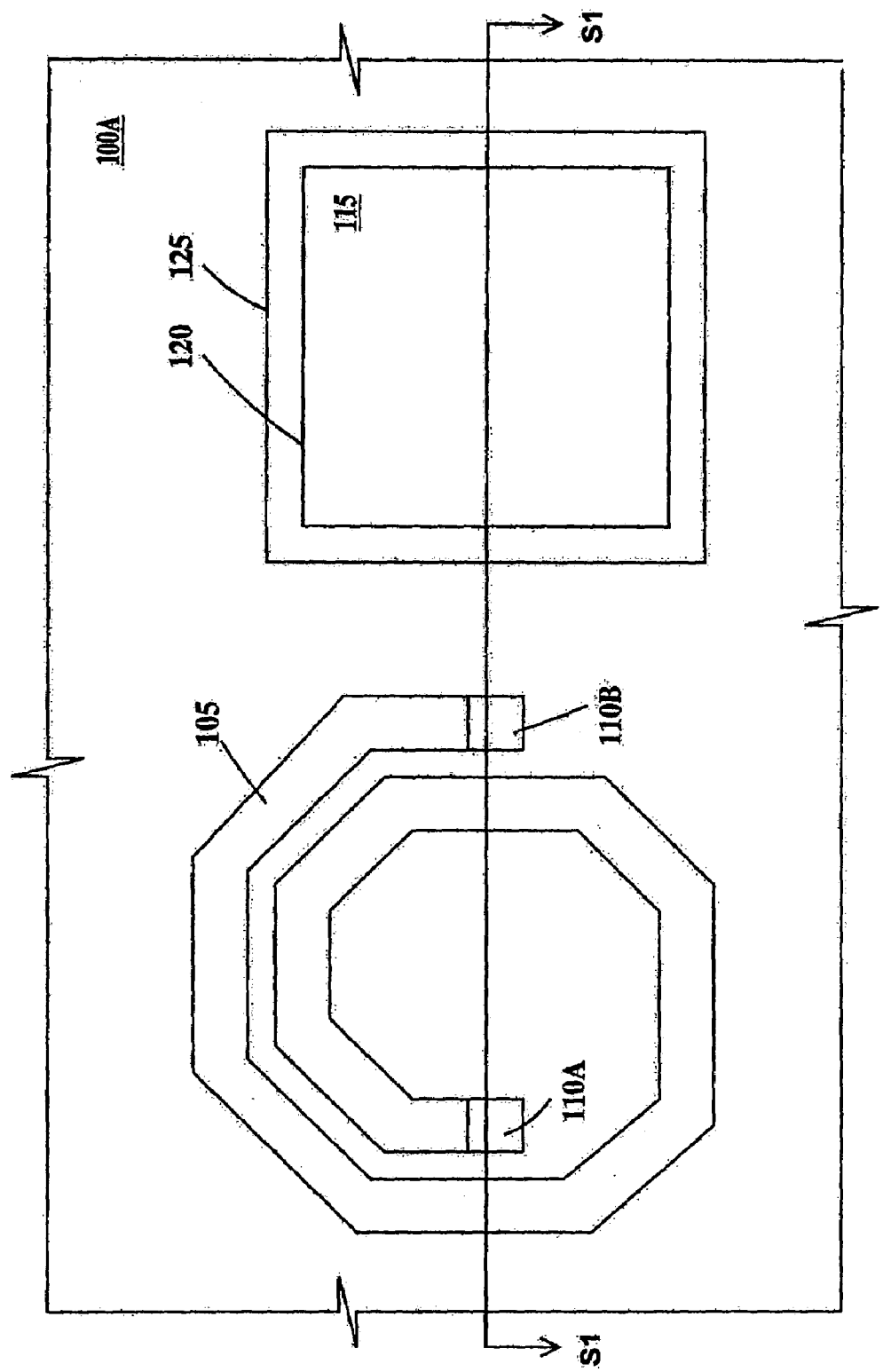
FIG. 1 is a top view of an inductor and contact pad according is according to a first embodiment of the present invention.

FIG. 1 is a top view of an inductor and contact pad according is according to a first embodiment of the present invention. In FIG. 1, an integrated circuit chip 100A includes an inductor 105 having integral vias 110A and 110B for interconnection to wiring levels (not shown) within the integrated circuit chip. While inductor 105 is illustrated as a spiral inductor the invention is applicable to inductors of other shapes as well. Integrated circuit chip 100A also includes an I/O terminal pad 115 in the bottom of a via 120 for interconnection to wiring levels (not shown) within the integrated circuit chip and a conductive passivation layer 125 formed on top of I/O terminal pad 115 and overlapping via 120.

Figure 2:
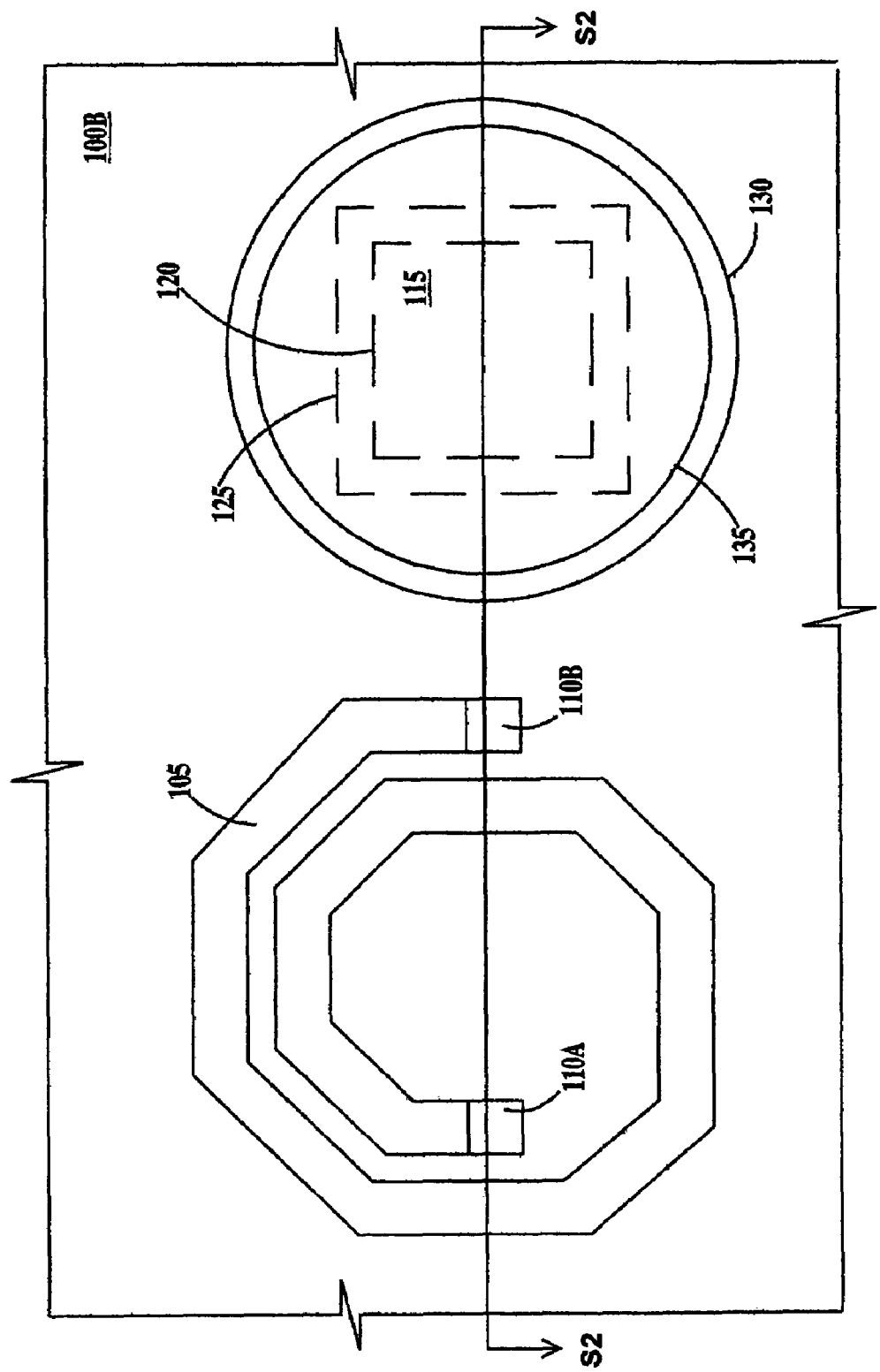
FIG. 2 is a top view of an inductor and contact pad according is according to a second embodiment of the present invention.

FIG. 2 is a top view of an inductor and contact pad according is according to a second embodiment of the present invention. In FIG. 2, an integrated circuit chip 100B includes inductor 105 having integral vias 110A and 110B for interconnection to wiring levels (not shown) within the integrated circuit chip. While inductor 105 is illustrated as a spiral inductor the invention is applicable to inductors of other shapes as well. Integrated circuit chip 100B also includes I/O terminal pad 115 in the bottom of via 120 for interconnection to wiring levels (not shown) within the integrated circuit chip, conductive passivation layer 125 formed on top of I/O terminal pad 115 and overlapping via 120, a pad limiting metallurgy (PLM) layer 130 and a solder ball 135 formed over conductive passivation layer 125. Solder balls are also known as controlled collapse chip connection (C4) balls, C4 solder balls and solder bumps. For the purposes of the present invention the term solder ball may be replaced with the term solder column. Solder columns are cylinders of Pb or Pb/Sn alloy and the present in invention is applicable to solder column interconnect technology as well.

Figure 3:
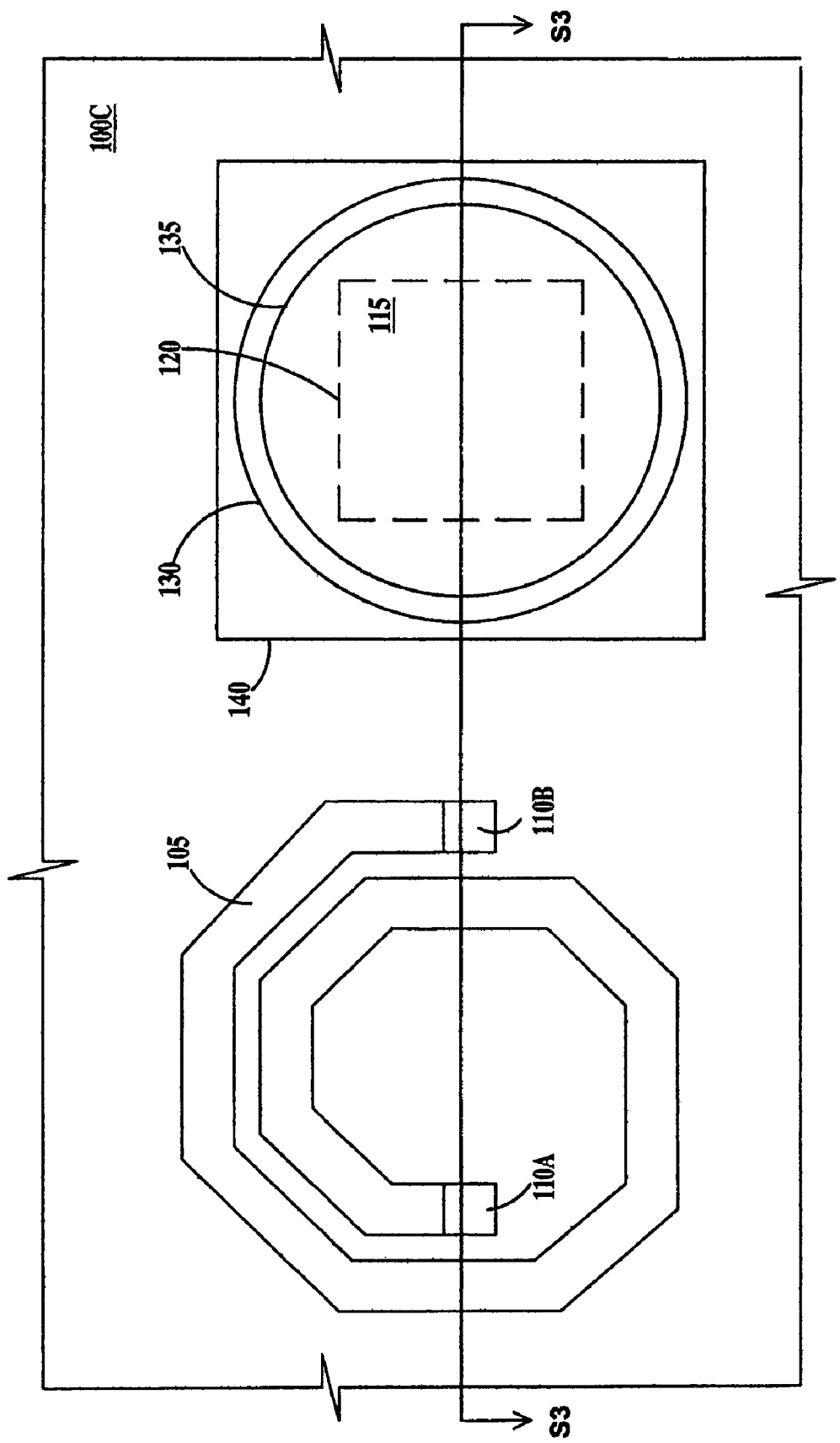
FIG. 3 is a top view of an inductor and contact pad according is according to a third embodiment of the present invention.

FIG. 3 is a top view of an inductor and contact pad according is according to a third embodiment of the present invention. In FIG. 3, an integrated circuit chip 100C includes inductor 105 having integral vias 110A and 110B for interconnection to wiring levels (not shown) within the integrated circuit chip. While inductor 105 is illustrated as a spiral inductor the invention is applicable to inductors of other shapes as well. Integrated circuit chip 100C also includes I/O terminal pad 115 in the bottom of via 120 for interconnection to wiring levels (not shown) within the integrated circuit chip, a conductive passivation coated raised pad 140 formed on top and overlapping via 120, PLM layer 130 and solder ball 135 formed over conductive passivation layer 125. PLM layer 130 is fully landed on raised pad 140.

FIGS. 4A through 4F are partial cross-sectional views illustrating fabrication steps common to the first, second and third embodiments of the present invention. FIGS. 4A through 4F may be taken through line S1—S1 of FIG. 1, line S2—S2 of FIG. 2 or of line S3—S3 of FIG. 3.

Figure 4A:
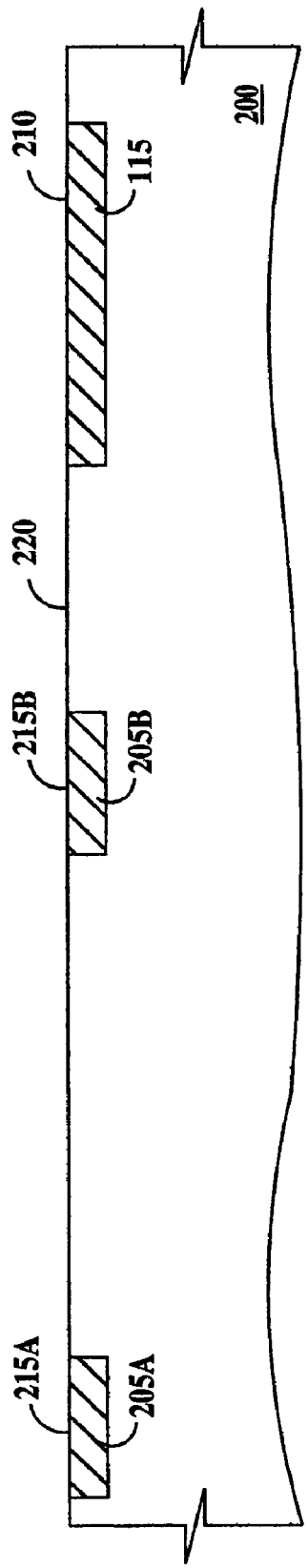

In FIG. 4A a semiconductor substrate 200 includes I/O terminal pad 115 and underpass wires 205A and 205B. A top surface 210 of I/O terminal pad 115 and top surfaces 215A and 215B of underpass wires 205A and 205B respectively, are co-planer with a top surface 220 of substrate 200. Underpass wires 205A and 205B and I/O terminal pad 115 electrically connect with wires in other wiring levels (not shown) and eventually electrically connect to active devices within substrate 200. Underpass wires 205A and 205B provide electrical connection to inductor 105 (see FIGS. 1, 2 or 3). In one example, I/O terminal pad 115 and underpass wires 205A and 205B comprise a TaN/Ta liner (the TaN layer is formed first) and a Cu core and are formed by a damascene or a dual damascene process; and the portion of substrate 200 illustrated in FIG. 4A comprises $SiO_2$. The TaN/Ta liner may be eliminated or replaced with a liner of comprised of other materials such as W, Ti and TiN.

In a damascene process, a trench is etched in a dielectric layer, an optimal conductive conformal liner and conductive seed layer deposited on the bottom and sidewalls of the trench as well as the top surface of the dielectric layer. Then a core conductor is deposited or plated onto the seed layer, filling the trench. Finally a chemical-mechanical-polish step is performed, removing all liner, seed layer and core conductor from the top surface of the dielectric layer and leaving a conductive filled trench, a top surface of the trench co-planer with the top surface of the dielectric layer. In a dual damascene process, vias open to a lower wiring level are formed in the bottom of the trench prior to formation of the liner or core conductor.

Figure 4B:
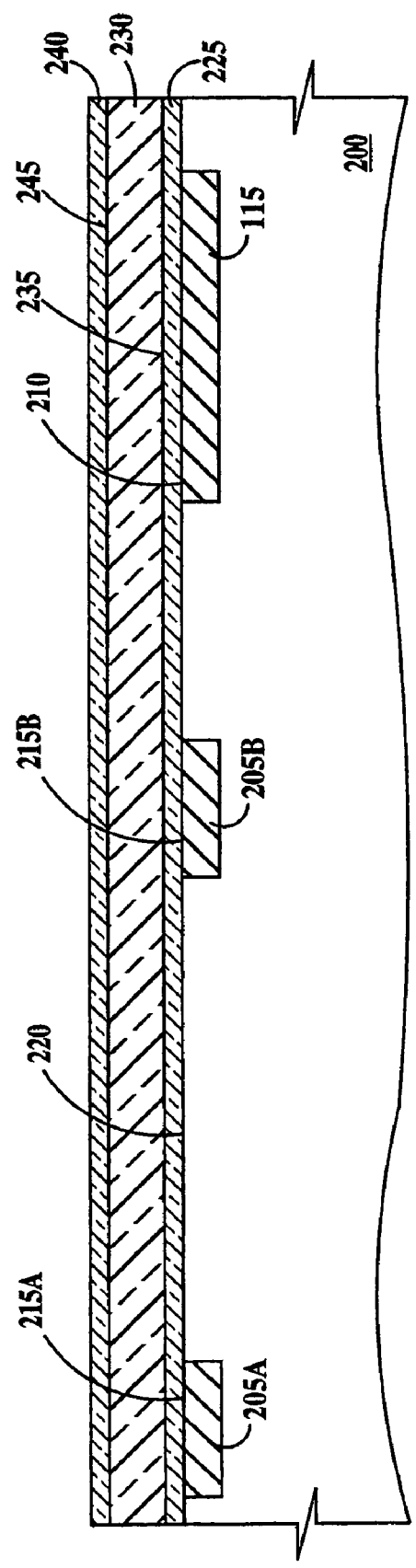

In FIG. 4B, a first dielectric layer 225 is formed on top surface 220 of substrate 200 as well as on top surfaces 215A and 125B and 210 of underpass wires 205A and 205B and I/O terminal pad 115 respectively. A second dielectric layer 230 is formed on a top surface 235 of first dielectric layer 225. A third dielectric layer 240 is formed on a top surface 245 of second dielectric layer 230. In one example, first dielectric layer 225 is $Si_3N_4$ about 350 Å to 1050 Å thick, second dielectric layer 230 is $SiO_2$ about 1500 Å 5000 Å thick and third dielectric layer 240 is $Si_3N_4$ about 2000 Å to 6000 Å thick.

It is possible to practice the present invention using only a single dielectric layer of for example, either $SiO_2$ or $Si_3N_4$ or a dual layer of for example, $SiO_2$ over $Si_3N_4$ in place of the three dielectric layers 225, 230 and 240.

Figure 4C:
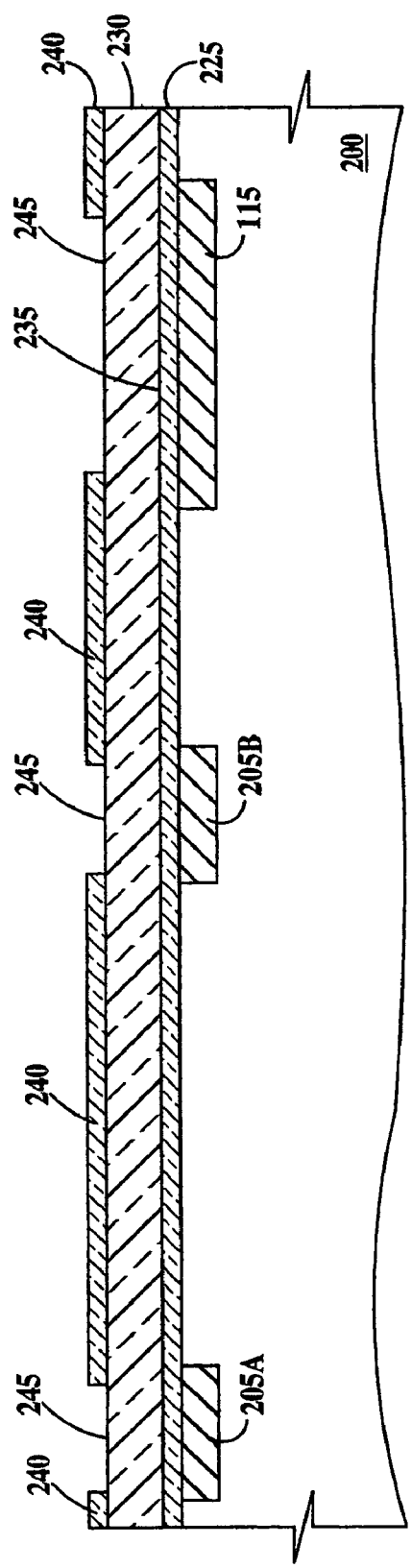
Figure 4D:
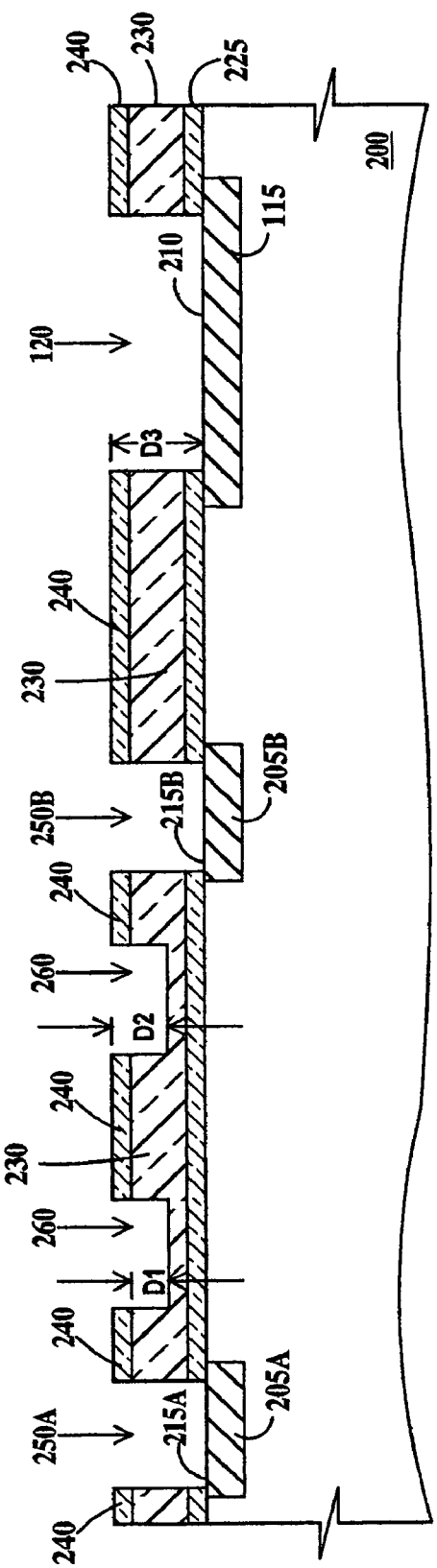

In FIG. 4C, portions of third dielectric layer 240 aligned over underpass wires 205A and 205B and I/O terminal pad 115 are removed, exposing top surface 245 of second dielectric layer 230. In FIG. 4D, portions of second dielectric layer 230 and first dielectric layer 225 aligned over underpass wires 205A and 205B and I/O terminal pad 115 are removed forming trenches 250A and 250B and via 120 respectively and exposing top surfaces 215A, 215B and 210 of underpass wires 205A and 205B and I/O terminal pad 115 respectively. Additionally, portions of third dielectric layer 240 and portions of second dielectric layer 230 are removed down to a depth D1 forms trenches 260.

It should be understood that trenches 250A, 250B and 260 are in reality one interconnected spiral trench in which inductor 105 (see FIGS. 1, 2 and 3) will be formed and that trenches 250A and 250B indicate those portions of the spiral trench in which vias 110A and 110B (see FIGS. 1, 2 and 3) are formed. Trenches 250A, 250B and 260 only appear as separate trenches in cross-section and to avoid confusion as to which portion of the spiral trench is being described at a given moment, the "separate" trench terminology will be used.

The exact removal depth D1, of second dielectric layer 230 in trenches 260 is not critical as long as sufficient second dielectric layer 230 remains in trenches 260 to protect dielectric layer 225 when dielectric layer 225 is removed in trenches 250A and 250B and via 120. In one example, D1 is about 2500 Å to 7500 Å. D2 is the depth of trenches 260 and D3 is the depth of trenches 250A and 250B and via 120. The difference in depth between trenches 260 and trenches 250A and 250B and via 120 is D3–D2.

The steps illustrated in FIGS. 4C and 4D can be accomplished by several methods. In a first method, a first layer of photoresist is applied, a first photolithographic process performed, a first reactive ion etch (RIE) process selective to etch, in the example presented supra, $Si_3N_4$ over $SiO_2$ is performed to define trenches 250A and 250B and via 120 in third dielectric layer 240 as illustrated in FIG. 4C. Then the first resist layer is removed, a second resist layer is applied, a second photolithographic process followed by a second RIE process selective to etch, in the example presented supra, $SiO_2$ over $Si_3N_4$ is performed in order to fully open trenches 250A and 250B and via 120 in second and third dielectric layer 240 as well as etch D1 into second dielectric layer 230 in trenches 260 as illustrated in FIG. 4D. The second layer of resist is then removed.

In a second method, a single dual tone resist layer (stacked or composite positive/negative resist) is applied, and a photolithographic step using a dual tone photomask is performed to completely remove the resist layer where trenches 250A and 250B and via 120 are to be formed and only partially remove the resist layer (thin the resist layer down) where trenches 260 are to be formed. A single RIE etch is then performed to form the structures illustrated in FIG. 4D (FIG. 4C is skipped). The dual tone resist layer is then removed. In either case a clean up etch may be performed, for example a wet etch using dilute HF.

In FIG. 4E, a conformal liner 265 is deposited on a top surface 270 of third dielectric layer 240 as well as on the sidewalls and bottoms of trenches 250A, 250B and 260 and via 120. A conformal seed layer 275 is then deposited on a top surface 280 of liner 265. In one example, liner 265 is about 200 Å to 5000 Å of Ta deposited over about 10 Å to 1000 Å of TaN and seed layer 275 is about 100 Å to 1500 Å of Cu, both formed by physical vapor deposition (PVD) or ionized physical vapor deposition (IPVD).

In FIG. 4F, a CMP process is performed to remove seed layer 275 from liner 265 wherever liner 265 is contacting top surface 270 of third dielectric layer 265, but leave the seed layer on the sidewalls and bottom of trenches 250A, 250B and 260 and via 120. CMP may be followed by an optional clean up etch. In the example of seed layer 275 being Cu, a dilute oxalic acid/HF etchant may be used for the clean up etch. An optional Cu clean up etch may also be performed.

In a second method, the aforementioned CMP process is not performed, and seed layer 275 remains everywhere on top of liner 265. Seed layer 275 will be removed in subsequent steps as described infra.

This concludes the part of the inductor fabrication that is common to all embodiments of the present invention. It should be noted that while the invention has been described using first dielectric layer 225, second dielectric 230 and third dielectric layer 240, it is possible to practice the present invention using more or fewer dielectric layers. For example, a single dielectric layer or two dielectric layers may be used instead of the three dielectric layers described supra.

FIGS. 5A through 5F are partial cross-sectional views illustrating fabrication steps subsequent to the steps illustrated in FIGS. 4A through 4F, common to the first and second embodiments of the present invention. FIGS. 5A through 5F are taken through line S1—S1 of FIG. 1 in the case of the first embodiment or line S2—S2 of FIG. 2 in the case of the second embodiment.

In FIG. 5A, a resist layer 285 is formed and patterned, exposing seed layer 275 on the bottom and sidewalls of trenches 250A, 250B and 260, but protecting via 120. Resist layer 285 has thickness D4. Patterned resist layer 285 serves to increase the depth of trenches 250A, 250B and 260. In one example, D4 is about 8 to 20 microns thick. In one example, resist layer 285 may be any conventional spun applied resist. In a second example D4 is about 20 to 50 microns. Above about 20 microns, Riston®, manufactured by Dupont (Wilmington, Del.) or other roll applied resists may be used. The value of D4 is one of the factors controlling the thickness of inductor 105 (see FIG. 2) that will be formed as illustrated in FIG. 5B and described infra.

In FIG. 5B trenches 250A, 250B, and 260 are partially filled with a thickness D5 of metal by electroplating using seed layer 275 as a cathode to form inductor 105. The thickness D5 is another factor controlling the thickness of inductor 105. Note that individual islands of seed layer 275 are electrically connected by liner 265 which is effectively a blanket, albeit conformal, conductive coating extending over all of substrate 200. Generally, the plating process is stopped when the metal reaches within about 1 to 2 microns of filling trench 260 of resist layer 285 in order make subsequent removal of the resist layer easier. It is possible to overfill the trenches and then CMP the excess metal. In one example, inductor 105 is formed of electroplated Cu. An exemplary Cu plating process is described in U.S. Pat. No. 6,368,484 to Volant et al., which is hereby incorporated in its entirety by reference. In one example D5 is about 5 to 50 microns.

In FIG. 5C, resist layer 285 (see FIG. 5B) is removed. The width W1 and spacing S1 of the coils of inductor 105 is not limited by the present invention. W1 and S1 are limited by the minimum line/space printable with the particular photolithographic process (resist system, mask technology and exposure tool and wavelength) at the lower end and by the amount of integrated real estate available for inductors at the upper end. In one example W1 is about 2 to 30 microns and S1 is about 2 to 20 microns.

In the second method, seed layer 275 is now removed from regions where it is exposed, for example by wet etch. In one example, the wet etch is a mixture of sulfuric acid, ammonium persulfate and water. The etch rate for Cu must be slow enough that a controllable removal of seed layer 275 may be accomplished without substantial etching or undercutting of inductor 105 or other plated Cu structures.

In FIG. 5D, a first conductive passivation layer 290 is selectively electroplated over all exposed surfaces of seed layer 275 but not on exposed liner 265. A second conductive passivation layer 295 is selectively electroplated over all exposed surfaces of first conductive passivation layer 290 but not on exposed liner 265. In one example, first conductive passivation layer 290 is Ni about 2000 Å to 6000 Å thick and second conductive passivation layer 295 is Au about 1200 Å to 4000 Å thick. It is possible to use a single conductive passivation layer. First conductive passivation layer 290 and second conductive passivation layer 295 are equivalent to conductive passivation layer 125 illustrated in FIGS. 1, 2 and 3 and described supra.

In FIG. 5E, all exposed liner 265 is removed. In the example of liner 265 being TaN/Ta and second conductive passivation layer 295 being Au, a fluorine based RIE may be used.

In FIG. 5F, a blanket organic passivation layer 300 is applied and photolithographically patterned to expose a contact pad 305 over I/O terminal pad 115. In one example blanket organic passivation layer 300 is polyimide. A polyimide layer is typically provided by coating with a polyimide precursor and then converting the precursor to the cured polyimide by heating. Commercially available polyimide precursors (polyamic acid) or various polyimide precursors manufactured by DuPont, (Wilmington, Del.) are available under the trade designations Pyralin. These polyimide precursors come in many grades including those available under the trade designations PI-2555, PI2545, PI-2560, PI-5878, PIH-61454 and PI-2540. Some of these are pyromelletic dianhydride-oxydianline (PMA-ODA) polyimide precursors. The cured polyimide layer is about 0.4 to 5 microns thick. Contact pad 305 may be used as a wirebond pad. In wire bonding, an Al or Au wire is ultrasonically welded or bonded to a contact pad. This concludes fabrication of the first embodiment of the present invention.

Figure 5G:
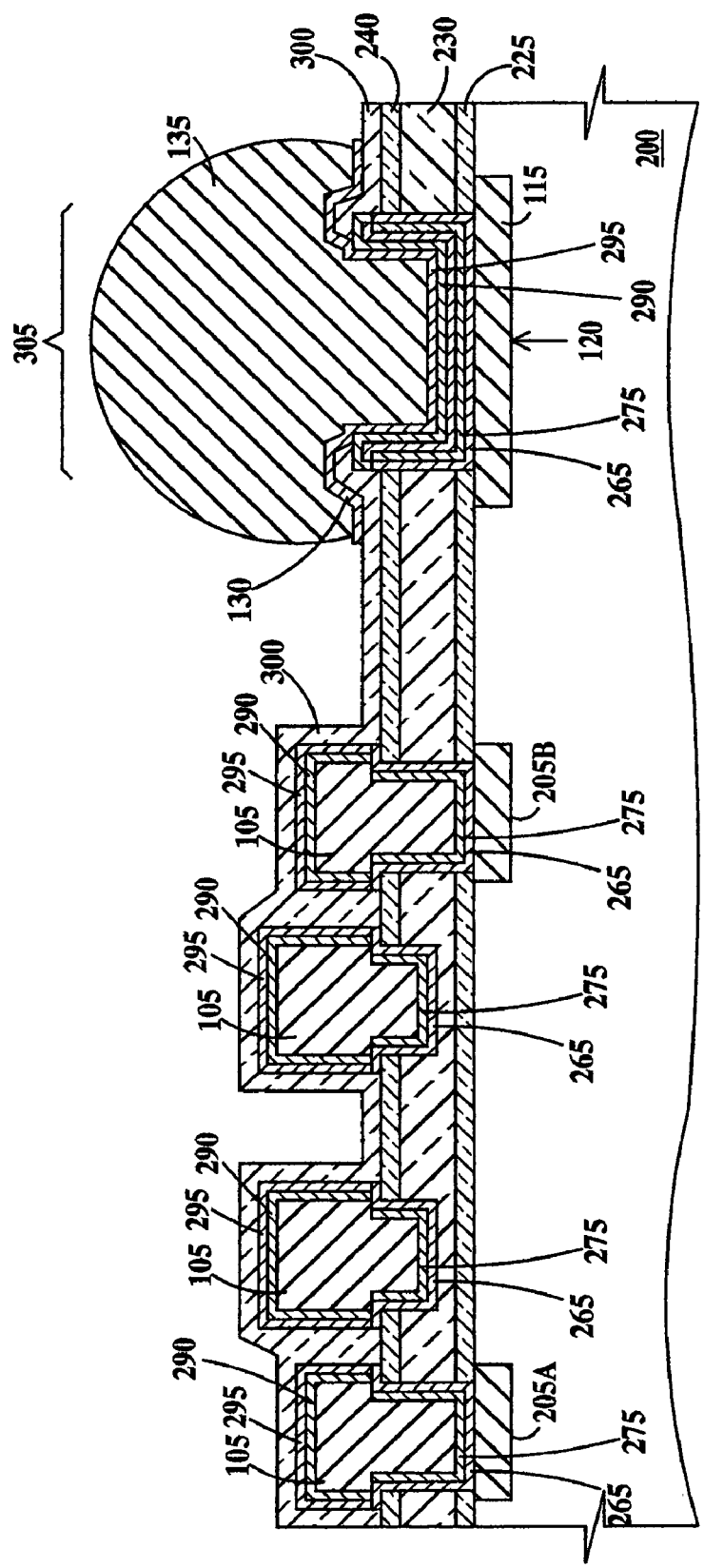
FIG. 5G is a partial cross-sectional view illustrating a fabrication step subsequent to the steps illustrated in FIGS. 5A through 5F, for the second embodiment of the present invention.

FIG. 5G is a partial cross-sectional view illustrating a fabrication step subsequent to the steps illustrated in FIGS. 5A through 5F, for the second embodiment of the present invention. FIG. 5G is taken through line S2—S2 of FIG. 2. In FIG. 5G, PLM layer 130 is formed to electrically contact raised contact pad 305 and solder ball 135 is formed on PLM layer 130. PLM 130 and solder ball 135 may be formed by a through mask plated C4 process. Through mask plated C4 processes are well known in the art, but briefly involve evaporating or sputtering a PLM and a seed layer, forming a patterned photomask on a wafer, plating Pb or Pb/Sn alloy, stripping the photomask and etching away exposed PLM and seed layer. An exemplary C4 plating process is described in U.S. Pat. No. 6,297,140 to Uzoh et al. and in U.S. Pat. No. 6,251,428 also to Uzoh et al., both of which are hereby incorporated in their entireties by reference. In one example of a through plated C4 process, PLM layer 130 comprises a triple layer of TiW/CrCu/Cu and solder ball 135 is comprised of Pb or Pb/Sn alloy. Solder ball 135 is illustrated after either a post-evaporative or post plating reflow anneal. In one example, the TiW layer is about 250 Å to 2000 Å thick, the CrCu layer is about 100 Å to 2000 Å thick and the Cu layer is about 1000 Å to 20,000 Å thick. This concludes fabrication of the second embodiment of the present invention.

Because inductor 105 (see FIG. 5G) is significantly higher than contact pad 305, an evaporative C4 processes cannot be used to form PLM 130 and solder ball 135 of FIG. 5G because the molybdenum mask used in an evaporative C4 process would be so far from the contact pad so as to cause intolerable amount of under mask evaporation. The third embodiment of the present invention provides a pad structure that allows for the use of an evaporative C4 process.

FIGS. 6A through 6G are partial cross-sectional views illustrating fabrication steps subsequent to the steps illustrated in FIGS. 4A through 4F, for the third embodiment of the present invention. FIGS. 6A through 6G are taken through line S3—S3 of FIG. 3.

In FIG. 6A, resist layer 285 is formed and patterned, exposing seed layer 275 on the bottom and sidewalls of trenches 250A, 250B and 260 and via 120. The composition and thickness of resist layer 285 has been described supra.

In FIG. 6B trenches 250A, 250B and 260 and via 120 are partially filled with a metal by electroplating using seed layer 275 as a cathode to form inductor 105 and raised pad 140. Note that individual islands of seed layer 275 are electrically connected by liner 265 which is effectively a blanket, albeit conformal, conductive coating extending over all of substrate 200. Generally, the plating process is stopped when the metal reaches about 1 to 2 microns of the top surface of resist layer 285 in order make subsequent removal of the resist layer easier. It is possible to overfill the trenches and then CMP the excess metal. The composition and thickness of inductor 105 has been described supra.

In FIG. 6C, resist layer 285 (see FIG. 6B) is removed. The width W1 and spacing S1 of the coils of inductor 105 have been discussed supra.

In the second method, seed layer 275 is now removed from regions where it is exposed as described supra.

In FIG. 6D, first conductive passivation layer 290 is selectively electroplated over all exposed surfaces of inductor 105 and raised pad 140 but not on exposed liner 265. Second conductive passivation layer 295 is selectively electroplated over all exposed surfaces of first conductive passivation layer 290 but not on exposed liner 265. The compositions and thicknesses of first passivation 290 and second passivation layer 295 have been described supra.

In FIG. 6E, all exposed liner 265 is removed. In the example of liner 265 being TaN/Ta and second conductive passivation layer 295 being Au, a fluorine based RIE may be used.

In FIG. 6F, blanket organic passivation layer 300 is applied and photolithographically patterned to expose a raised contact pad 310 over I/O terminal pad 115. The composition of blanket organic passivation layer 300 has been described supra. At this point in the fabrication of the third embodiment of the present invention, fabrication could be altered, a polyimide or other passivating coating applied as described supra and raised contact pad 310 used as a wirebond pad or as a landing pad for a cantilevered beam connection such as tape automated bonding (TAB) packaging in a fourth embodiment of the present invention.

Figure 6G:
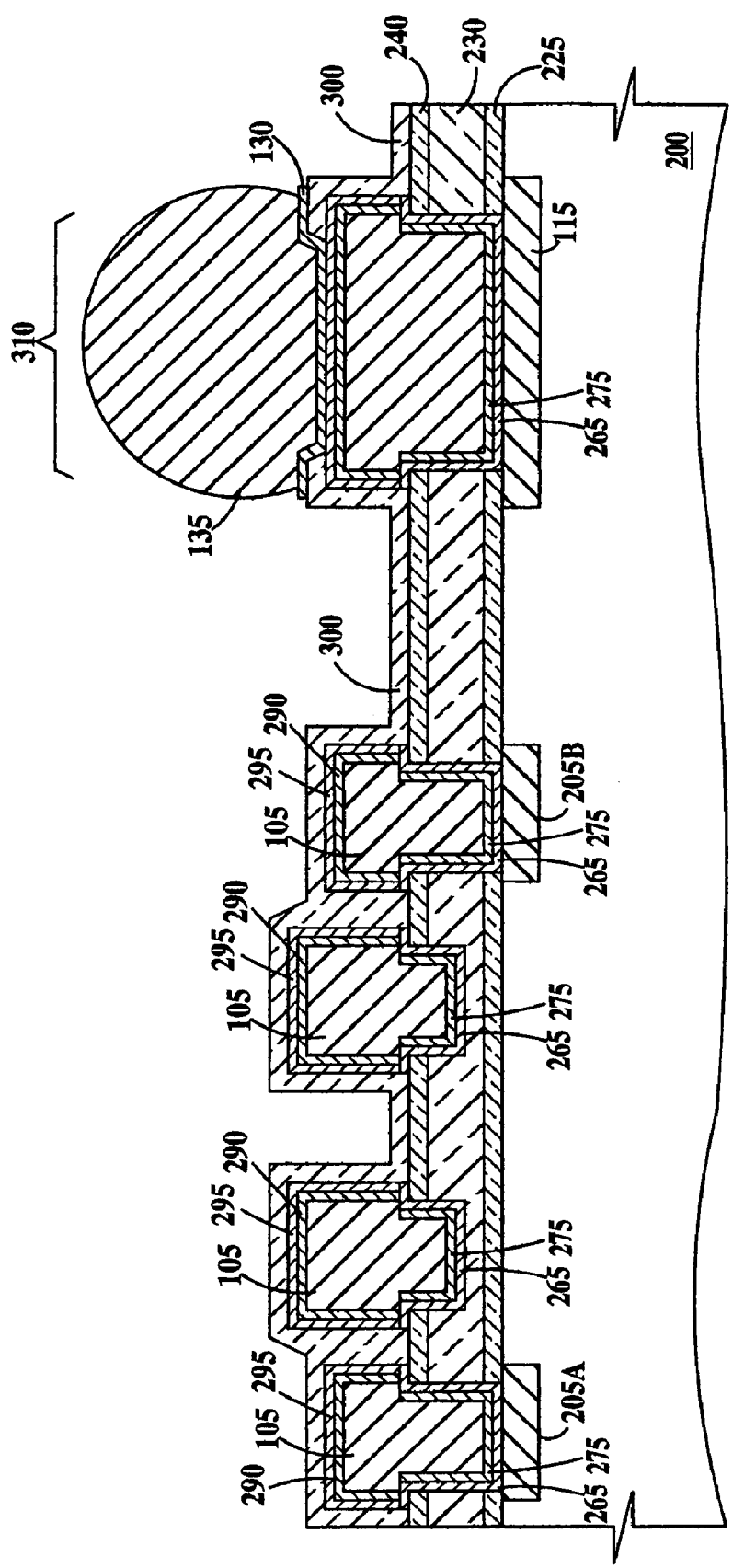

Continuing with the third embodiment of the present invention, in FIG. 6G, PLM layer 130 is formed on raised contact pad 310 and solder ball 135 is formed on PLM layer 130. PLM 130 and solder ball 135 may be formed by either a through mask plated C4 or an evaporative C4 process. Because of the height of raised contact pad 310 it is now possible to use an evaporative C4 process since the molybdenum evaporation mask will close enough to raised contact pad 310 to avoid the problems described supra when the mask is to far from the pad. Evaporative C4 processes are well known in the art, but involve placing a molybdenum mask in close proximity to a semiconductor wafer, first evaporating or sputtering PLM through holes in the mask, then evaporating Pb or Pb/Sn alloy through the same holes and then removing the mask. In one example of an evaporative C4 process, PLM layer 130 comprises a triple layer of Cr/CrCu/Au and solder ball 135 is comprised of Pb or Pb/Sn alloy. In one example, the Cr layer is about 100 Å to 1000 Å thick, the Cu layer is about 100 Å to 2000 Å thick and the Au layer is about 100 Å to 1,000 Å thick. Through mask plated C4 processes and materials have been described supra. This concludes fabrication of the third embodiment of the present invention.

All of the embodiments of the present invention have been shown to produce inductors having Q factors about equal or greater than 40 and having inductances of about equal or greater than 0.5 nH.

Thus, the present invention provides not only high Q factor, thick metal inductor formed of a high conductivity metal but also a method and integration for forming the inductor compatible with inter-connection layer fabrication techniques of integrated circuit chips.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example, while the present invention is described forming the inductor from a liner of TaN/Ta, a seed layer of Cu, and a Cu core, other conductive materials may be subsituted. Therefore it is intended that the following claims cover all such modifications and changes as fall within the true spirit and scope of the invention.

What is claimed is:

1. A semiconductor structure, comprising:
    an inductor having a top surface, a bottom surface and sidewalls, a lower portion of said inductor extending into but not completely through a single dielectric layer on a semiconductor substrate and an upper portion of said inductor extending above said dielectric layer, said lower portion of said inductor comprising a conductive liner and a core conductor and said upper portion of said inductor consisting only of said core conductor; and
    means to electrically contact said inductor.

2. The structure of claim 1, wherein said upper portion further comprises a conductive passivation layer on a top surface and sidewalls of said upper portion of said inductor.

3. The structure of claim 1, wherein said inductor has a height defined by said sidewalls of greater than about 5 microns.

4. The structure of claim 1, wherein said inductor extends parallel to a top surface of said dielectric layer in a spiral coil.

5. The structure of claim 4, wherein said inductor is about 2 to 30 microns wide and adjacent coils of said spiral coil are spaced apart about 2 to 20 microns.

6. The structure of claim 1, wherein said inductor has an inductance of greater than about 0.5 nH.

7. The structure of claim 1, wherein said inductor has a Q factor at greater than about 25.

8. The structure of claim 1, wherein said inductor has a Q factor of greater than about 40.

9. The structure of claim 1, further including:
an I/O terminal pad formed in said substrate; and
a raised contact pad in electrical contact with said I/O terminal pad, said raised contact pad having a top surface, a bottom surface and sidewalls, a lower portion of said inductor extending said fixed distance into said dielectric layer formed on a semiconductor substrata and an upper portion extending above said dielectric layer.

10. The structure of claim 9, wherein said lower portion of said raised contact pad comprises a conductive liner and a core conductor and said upper portion of said raised contact pad comprises said core conductor.

11. The structure of claim 10, wherein said core conductor is Cu and said liner comprises a dual layer of TaN and Ta.

12. The structure of claim 10, wherein said upper portion further comprises a Conductive passivation layer on said top surface and sidewalls of said upper portion of said raised contact pad.

13. The structure of claim 12, wherein said passivation layer comprises layer of Ni or a layer of Au over a layer of Ni.

14. The structure of claim 13, further including an Al or Au wire conductively bonded to said raised contact pad.

15. The structure of claim 13 further including a layer of pad limiting metallurgy on said passivation layer and a solder ball on said pad limiting metallurgy.

16. The structure of claim 15, wherein said pad limiting metallurgy comprises one or more layers selected from the group consisting of Cr layers, CrCu layers, Au layers, Cu layers and TiW layers and said solder ball comprises Pb or Pb/Sn alloy.

17. The structure of claim 9, wherein said top surface of said inductor is in a different plane than a top surface of said raised contact pad.

18. The structure of claim 9, wherein a top surface of said inductor is higher than said top surface of said raised contact pad relative to a top surface of said dielectric layer.

19. A structure, comprising:
and inductor having a top surface, a bottom surface and sidewalls, a lower portion of said inductor extending into but not completely through a single dielectric layer on a semiconductor substrate and an upper portion of said inductor extending above said dielectric layer, said lower portion of said inductor comprising a conductive liner and a core conductor and said upper portion of said inductor consists only of said core conductor, said core conductor comprising Cu and said liner comprising a dual layer of TaN and Ta.

20. A structure comprising:
an inductor having a top surface, a bottom surface and sidewalls, a lower portion of said inductor extending into but not completely through a single dielectric layer on a semiconductor substrate and an upper portion of said inductor extending above said dielectric layer, said lower portion of said inductor comprising a conductive liner and a core conductor and said upper portion of said inductor consisting only of said core conductor; and
a conductive passivation layer on a top surface and sidewalls of said upper portion of said inductor, said passivation comprising layer a layer of Ni or a layer of Au over a layer of Ni.

21. A structure, comprising:
an inductor having a top surface, a bottom surface and sidewalls, a lower portion of said inductor extending into but not completely through a single dielectric layer on a semiconductor substrate and an upper portion of said inductor extending above said dielectric layer, said lower portion extending a distance of less than 3 microns into said dielectric layer.

22. A structure, comprising:
an inductor having a top surface, a bottom surface and sidewalls, a lower portion of said inductor extending into but not completely through a single dielectric layer on a semiconductor substrate and upper portion of said inductor extending above said dielectric layer; and
integral vias extending from said bottom surface of said inductor through said dielectric layer and electrically contacting pass through metallurgy in said substrate.

23. The structure claim 22, wherein said top surface of said inductor over said vias is closer to a top surface of said dielectric layer than portions of said top surface of said inductor not over said vias.

24. A structure, comprising:
an inductor having a top surface, a bottom surface and sidewalls, a lower portion of said inductor extending into but not completely through a single dielectric layer on a semiconductor substrate and an upper portion of said inductor extending above said dielectric layer;
means to electrically contact said inductor; and
a contact pad comprising a via formed in said dielectric layer, said via exposing at least a portion of an I/O terminal pad in said substrate, sidewalls of said via and at least a portion of said I/O terminal pad covered with a passivation layer over a conformal seed layer over a conductive liner.

25. The structure of claim 24, wherein said conductive liner comprises a dual layer of TaN and Ta, said seed layer comprises Cu and said passivation layer comprises a layer of Ni or a layer of Au over a layer of Ni.

26. The structure of claim 25, further including an Al or Au wire conductively bonded to said contact pad.

27. The structure of claim 25 further including a layer of pad limiting metallurgy on said passivation layer and a solder ball on said pad limiting metallurgy.

28. The structure of claim 27, wherein said pad limiting metallurgy comprises one or more layers selected from the group consisting of Cr layers, CrCu layers, Au layers, Cu layers and TiW layers and said solder ball comprises Pb or Pb/Sn alloy.

29. The structure of claim 24, wherein said top surface of said inductor is in a different plane than a top surface of said contact pad.

30. The structure of claim 24, wherein a top surface of said inductor is higher than said top surface of said contact pad relative to a top surface of said dielectric layer.

* * * * *

UNITED STATES PATENT AND TRADEMARK OFFICE
CERTIFICATE OF CORRECTION

| | | |
|---|---|---|
| PATENT NO. | : 7,068,138 B2 | Page 1 of 1 |
| APPLICATION NO. | : 10/768773 | |
| DATED | : June 27, 2006 | |
| INVENTOR(S) | : Edelstein et al. | |

It is certified that error appears in the above-identified patent and that said Letters Patent is hereby corrected as shown below:

Column 9
Line 19, delete "substrata" and insert -- substrate --
Line 29, delete "Conductive" and insert -- conductive --

Signed and Sealed this

Tenth Day of October, 2006

JON W. DUDAS
*Director of the United States Patent and Trademark Office*